(12) United States Patent
Zhang

(10) Patent No.: US 12,213,332 B2
(45) Date of Patent: Jan. 28, 2025

(54) QUANTUM DOT LIGHT EMITTING PANEL, DISPLAY DEVICE, AND MANUFACTURING METHOD

(71) Applicants: Beijing BOE Technology Development Co., Ltd., Beijing (CN); BOE Technology Group Co., Ltd., Beijing (CN)

(72) Inventor: Aidi Zhang, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 489 days.

(21) Appl. No.: 17/762,000

(22) PCT Filed: May 12, 2021

(86) PCT No.: PCT/CN2021/093331
§ 371 (c)(1),
(2) Date: Mar. 18, 2022

(87) PCT Pub. No.: WO2021/258885
PCT Pub. Date: Dec. 30, 2021

(65) Prior Publication Data
US 2022/0344605 A1    Oct. 27, 2022

(30) Foreign Application Priority Data

Jun. 22, 2020    (CN) .......................... 202010572243.8

(51) Int. Cl.
*H10K 50/115*    (2023.01)
*G03F 7/038*    (2006.01)
(Continued)

(52) U.S. Cl.
CPC ........... *H10K 50/115* (2023.02); *H10K 59/35* (2023.02); *H10K 71/00* (2023.02); *H10K 85/111* (2023.02);
(Continued)

(58) Field of Classification Search
CPC ...... H10K 50/115; H10K 59/35; H10K 71/00; H10K 85/111; H10K 50/18; H10K 71/233;
(Continued)

(56) References Cited

U.S. PATENT DOCUMENTS 5,537,000 A * 7/1996 Alivisatos .............. B82Y 30/00
313/499
7,651,674 B2 * 1/2010 Jun ....................... C09K 11/565
977/773
(Continued)

FOREIGN PATENT DOCUMENTS

CN    101384963 A    3/2009
CN    105552241 A    5/2016
(Continued)

OTHER PUBLICATIONS

CN202010572243.8 first office action.

*Primary Examiner* — Caleb E Henry
(74) *Attorney, Agent, or Firm* — IPro, PLLC

(57) ABSTRACT

The present disclosure provides a quantum dot light emitting panel, a display device, and a manufacturing method. The quantum dot light emitting panel comprises: a base substrate; a cathode layer, located on a side of the base substrate; an electron transfer layer, located on a side of the cathode layer located away from the base substrate; a quantum dot light emitting layer, located on a side of the electron transfer layer located away from the cathode layer, and having at least two light emitting portions having
(Continued)

mutually different wavelength ranges of emitted light; a photosensitive polymer film layer, located between the quantum dot light emitting layer and the electron transfer layer, having photosensitive portions in a one-to-one correspondence with the light emitting portions, and configured such that molecular chains break when the photosensitive polymer film layer is subjected to preconfigured light irradiation; and an anode layer, located on a side of the quantum dot light emitting layer located away from the photosensitive polymer film layer.

19 Claims, 4 Drawing Sheets

(51) Int. Cl.
    *G03F 7/039*     (2006.01)
    *H10K 50/18*     (2023.01)
    *H10K 59/35*     (2023.01)
    *H10K 71/00*     (2023.01)
    *H10K 85/10*     (2023.01)

(52) U.S. Cl.
    CPC .............. *G03F 7/038* (2013.01); *G03F 7/039* (2013.01); *H10K 50/18* (2023.02)

(58) Field of Classification Search
    CPC ......... H10K 59/38; G03F 7/038; G03F 7/039; G03F 7/004
    See application file for complete search history.

(56) References Cited

U.S. PATENT DOCUMENTS

| | | | | |
|---|---|---|---|---|
| 7,910,400 | B2* | 3/2011 | Kwon | H10K 50/115 |
| | | | | 257/E21.007 |
| 9,768,404 | B1* | 9/2017 | Steckel | C09K 11/025 |
| 9,812,004 | B1* | 11/2017 | Boshernitzan | G08C 17/02 |
| 9,831,706 | B2* | 11/2017 | MacWilliams | H02J 7/32 |
| 9,874,693 | B2* | 1/2018 | Baiocco | H01L 21/762 |
| 10,394,378 | B2* | 8/2019 | Huang | G06F 3/0412 |
| 10,826,011 | B1* | 11/2020 | Angioni | H10K 59/122 |
| 2006/0039850 | A1* | 2/2006 | Jun | C09K 11/08 |
| | | | | 423/561.1 |
| 2007/0148591 | A1 | 6/2007 | Nagahara | |
| 2008/0278068 | A1 | 11/2008 | Huang et al. | |
| 2010/0140586 | A1* | 6/2010 | Char | C09K 11/883 |
| | | | | 257/14 |
| 2012/0280345 | A1* | 11/2012 | Zhu | G02B 6/1226 |
| | | | | 257/E31.127 |
| 2013/0009131 | A1* | 1/2013 | Kazlas | H10K 50/17 |
| | | | | 257/13 |
| 2013/0037778 | A1* | 2/2013 | Kazlas | C09K 11/883 |
| | | | | 257/E29.024 |
| 2014/0027816 | A1* | 1/2014 | Cea | H01L 29/1054 |
| | | | | 257/E29.085 |
| 2014/0197507 | A1* | 7/2014 | Assefa | H01L 31/0745 |
| | | | | 438/69 |
| 2015/0091093 | A1* | 4/2015 | Bouche | H01L 29/45 |
| | | | | 257/369 |
| 2015/0268417 | A1* | 9/2015 | Assefa | H01L 27/1461 |
| | | | | 385/14 |
| 2016/0027848 | A1* | 1/2016 | Liu | H10K 59/38 |
| | | | | 257/40 |
| 2016/0240590 | A1* | 8/2016 | Liu | H10K 50/17 |
| 2016/0248029 | A1* | 8/2016 | Liu | H10K 59/35 |
| 2017/0115823 | A1* | 4/2017 | Huang | G06F 3/0421 |
| 2017/0221969 | A1* | 8/2017 | Steckel | H10K 59/32 |
| 2018/0019371 | A1* | 1/2018 | Steckel | H01L 27/1225 |
| 2018/0108842 | A1 | 4/2018 | Li et al. | |
| 2018/0254421 | A1* | 9/2018 | Kinge | H10K 30/35 |
| 2018/0309078 | A1* | 10/2018 | Ju | H10K 71/421 |
| 2018/0351125 | A1* | 12/2018 | He | H10K 50/16 |
| 2018/0366672 | A1* | 12/2018 | Wang | H10K 71/12 |
| 2019/0051849 | A1* | 2/2019 | Zhou | H10K 50/156 |
| 2019/0131587 | A1 | 5/2019 | Chen | |
| 2019/0157595 | A1* | 5/2019 | Seo | H10K 50/15 |
| 2019/0296264 | A1* | 9/2019 | Mathai | H10K 50/82 |
| 2020/0185462 | A1* | 6/2020 | Lee | H10K 50/16 |
| 2020/0203650 | A1* | 6/2020 | Kim | H10K 59/38 |
| 2021/0028385 | A1* | 1/2021 | Sakakibara | H05B 33/10 |
| 2021/0043864 | A1* | 2/2021 | Li | B82Y 30/00 |
| 2021/0151629 | A1* | 5/2021 | Boardman | H01L 33/387 |
| 2021/0408416 | A1* | 12/2021 | Angioni | H10K 71/00 |
| 2021/0408417 | A1* | 12/2021 | Angioni | H10K 50/80 |
| 2022/0013744 | A1* | 1/2022 | Sakakibara | H05B 33/14 |
| 2022/0098479 | A1* | 3/2022 | Mei | C09K 11/54 |

FOREIGN PATENT DOCUMENTS

| | | |
|---|---|---|
| CN | 107799672 A | 3/2018 |
| IN | 106597813 A | 4/2017 |

* cited by examiner

QUANTUM DOT LIGHT EMITTING PANEL, DISPLAY DEVICE, AND MANUFACTURING METHOD

CROSS REFERENCE TO RELATED APPLICATIONS

The present application is a national phase entry under 35 U.S.C. § 371 of International Application No. PCT/CN2021/093331, filed on May 12, 2021, which claims priority to Chinese patent application No. 202010572243.8 filed on Jun. 22, 2020 to the China National Intellectual Property Administration, and entitled "QUANTUM DOT LIGHT EMITTING PANEL, DISPLAY DEVICE, AND MANUFACTURING METHOD", the entire content of which is incorporated herein by reference.

FIELD

The present disclosure relates to the technical field of display, in particular to a quantum dot light emitting panel, a display device and a manufacturing method.

BACKGROUND

Semiconductor quantum dots are important fluorescent nano materials. Applying the quantum dots to the fields of panel illumination and electro-optic display as light emitting layer materials has attracted more and more attention from academia and industry. By now, in the aspect of device performance, external quantum efficiency (EQE) of quantum dot light emitting diodes (QLED) has reached 20% or above. Currently, a patterning process of quantum dots in the light emitting layer is a key step that decides a full-color high-resolution QLED device. At present, there have been transfer printing, ink-jet printing, photoetching and other ways for realizing quantum dot patterning processes.

From the view of actual industrial production, a photo etching process is usually adopted for patterning of electron materials (quantum dots). Photoresist is required for in the photo etching process. Photoresist is divided into positive photoresist and negative photoresist. However, during forming patterned quantum dots for different colors through a process using photoresist, there is a problem that quantum dot film layers will be damaged, impacting light emitting efficiency of a quantum dot light emitting panel.

SUMMARY

The present disclosure provides a quantum dot light emitting panel, including:
a base substrate;
a cathode layer, disposed on a side of the base substrate;
an electron transfer layer, disposed on a side of the cathode layer facing away from the base substrate;
a quantum dot light emitting layer, disposed on a side of the electron transfer layer facing away from the cathode layer, having at least two light emitting portions having different wavelength ranges of emitted light;
a photosensitive polymer film layer, located between the quantum dot light emitting layer and the electron transfer layer, having photosensitive portions in a one-to-one correspondence with the light emitting portions, and configured such that molecular chains break when the photosensitive polymer film layer is subjected to preset light irradiation; and
an anode layer, disposed on a side of the quantum dot light emitting layer facing away from the photosensitive polymer film layer.

In some embodiments, an electron mobility of the photosensitive polymer film layer is lower than that of the electron transfer layer.

In some embodiments, blocking portions are provided between the photosensitive portions.

In some embodiments, the electron transfer layer and the photosensitive polymer film layer are connected through a covalent bond.

In some embodiments, the electron transfer layer has a hydroxy, the photosensitive polymer film layer has an amino, and the electron transfer layer and the photosensitive polymer film layer form the covalent bond through the hydroxy and the amino.

In some embodiments, the electron transfer layer is made of a metal oxide.

In some embodiments, a material of the metal oxide is zinc oxide, magnesium zinc oxide or aluminum zinc oxide.

In some embodiments, the photosensitive portions further have one or a combination of following covalent bonds: a C—C bond; a C—O bond; an ester bond; or a thioester bond. Here the C—C bond, the C—O bond, the ester bond and the thioester bond break when being subjected to preset light irradiation.

In some embodiments, a material of the photosensitive portions is:

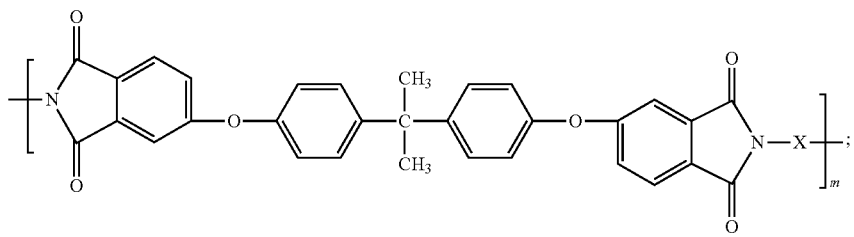

here m is the quantity of structural units, and 1<m<100.

In some embodiments, an X functional group is one of following:

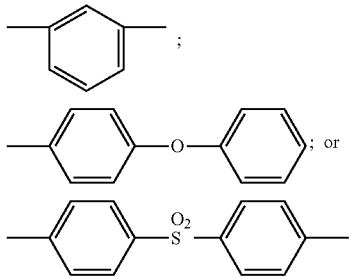

In some embodiments, a material of the photosensitive portions is:

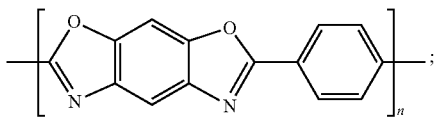

here n is the quantity of structural units, and 1<n<100.

In some embodiments, a thickness of the light emitting portions is 30 nm to 60 nm.

In some embodiments, a hole transfer layer is further provided between the quantum dot light emitting layer and the anode layer; and a hole injection layer is further provided between the hole transfer layer and the anode layer.

An embodiment of the present disclosure further provides a display device, including the quantum dot light emitting panel provided by an embodiment of the present disclosure.

An embodiment of the present disclosure further provides a manufacturing method of a quantum dot light emitting panel, including:
  providing a base substrate;
  forming a cathode layer on a side of the base substrate;
  forming an electron transfer layer on a side of the cathode layer facing away from the base substrate;
  forming a quantum dot light emitting layer on a side of the electron transfer layer facing away from the cathode layer, and forming a photosensitive polymer film layer between the quantum dot light emitting layer and the electron transfer layer; wherein the quantum dot light emitting layer includes at least two light emitting portions having different wavelength ranges of emitted light, and the photosensitive polymer film layer includes photosensitive portions in a one-to-one correspondence with the light emitting portions, and is configured such that molecular chains break when the photosensitive polymer film layer is subjected to preset light irradiation; and
  forming an anode layer on a side of the quantum dot light emitting layer facing away from the photosensitive polymer film layer.

In some embodiments, the forming the quantum dot light emitting layer on the side of the electron transfer layer facing away from the cathode layer and the forming the photosensitive polymer film layer between the quantum dot light emitting layer and the electron transfer layer, include:
  forming a photosensitive polymer thin film on a side of the electron transfer layer facing away from the cathode layer;
  forming a first quantum dot light emitting thin film on a side of the photosensitive polymer thin film facing away from the electron transfer layer;
  shielding a first region via a first mask, and irradiating by preset light, to make molecular chains of the photosensitive polymer thin film not shielded by the first mask break; removing the photosensitive polymer thin film with the molecular chains breaking and the first quantum dot light emitting thin film by cleaning by a solution to form a first light emitting portion;
  forming a photosensitive polymer thin film on a side of the electron transfer layer facing away from the cathode layer;
  forming a second quantum dot light emitting thin film on a side of the photosensitive polymer thin film facing away from the electron transfer layer;
  shielding a second region through a second mask, and irradiating by the preset light, to make molecular chains of the photosensitive polymer thin film not shielded by the second mask or by the first light emitting portion break, wherein the second region and the first region are not overlapped with each other;
  removing the photosensitive polymer thin film with the molecular chains breaking and the second quantum dot light emitting thin film via cleaning by a solution to form a second light emitting portion;
  forming a photosensitive polymer thin film on a side of the electron transfer layer facing away from the cathode layer;
  forming a third quantum dot light emitting thin film on a side of the photosensitive polymer thin film facing away from the electron transfer layer;
  shielding a third region through a third mask, and irradiating by the preset light, to make molecular chains of the photosensitive polymer thin film not shielded by the third mask, the first light emitting portion or the second light emitting portion break, wherein the third region is not overlapped with the first region or the second region; and
  removing the photosensitive polymer thin film with the molecular chains breaking and the third quantum dot light emitting thin film via cleaning by a solution to so as to form a third light emitting portion.

In some embodiments, the forming the photosensitive polymer thin film on the side of the electron transfer layer facing away from the cathode layer, includes:
  dissolving a polyetherimido compound or poly-p-phenylene benzo-bisthiazole into ethanol, and spin-coating onto a side of the electron transfer layer facing away from the cathode layer; and
  heating to volatilize a solvent.

In some embodiments, the irradiating by the preset light, includes: irradiating by ultraviolet light.

In some embodiments, the cleaning by the solution, includes: flushing by anhydrous ethanol.

DETAILED DESCRIPTION

In order to make the object, technical solutions and advantages of embodiments of the present disclosure clearer, the technical solutions of the embodiments of the present disclosure will be clearly and completely described below in conjunction with the accompanying drawings of the embodiments of the present disclosure. Apparently, the described embodiments are only a part of the embodiments of the present disclosure, not all of the embodiments. Based on the described embodiments of the present disclosure, all other embodiments obtained by those of ordinary skill in the art without creative work shall fall within the protection scope of the present disclosure.

Unless otherwise defined, technical or scientific terms used in the present disclosure shall have the ordinary meanings understood by those ordinarily skilled in the art to which the present disclosure pertains. The words "first", "second" and the like used in the present disclosure do not indicate any order, quantity or importance, but are only configured to distinguish different components. The words "comprise" or "include" and the like indicate that an element or item appearing before such the word covers listed elements or items appearing after the word and equivalents thereof, and does not exclude other elements or items. The words "connect" or "couple" or the like are not limited to physical or mechanical connection, but may include electrical connection, whether direct or indirect. "Upper", "lower", "left", "right" and the like are only used to represent relative position relationships, and the relative position relationships may also change accordingly after an absolute position of a described object is changed.

In order to keep the following descriptions of the embodiments of the present disclosure clear and concise, detailed descriptions of known functions and known components are omitted.

The following problems usually occur when patterning of electron materials (quantum dots) using the photoresist.

The cost of negative photoresist is low, but a developing solution usually uses p-xylene. Organic solvents containing benzene are toxic and not conducive to environmental protection. Positive photoresist has good contrast, so generated pattern have a good resolution, and a developing solution is an alkaline aqueous solution, which is conducive to environmental protection. However, the alkaline solution will destroy quantum dots of a light emitting layer. Therefore, finding a more moderate developing process or a more environmental-friendly patterning process to prepare high-resolution and full-color QLEDs is a difficult point and has become the focus of quantum dot display process research.

Figure 1:
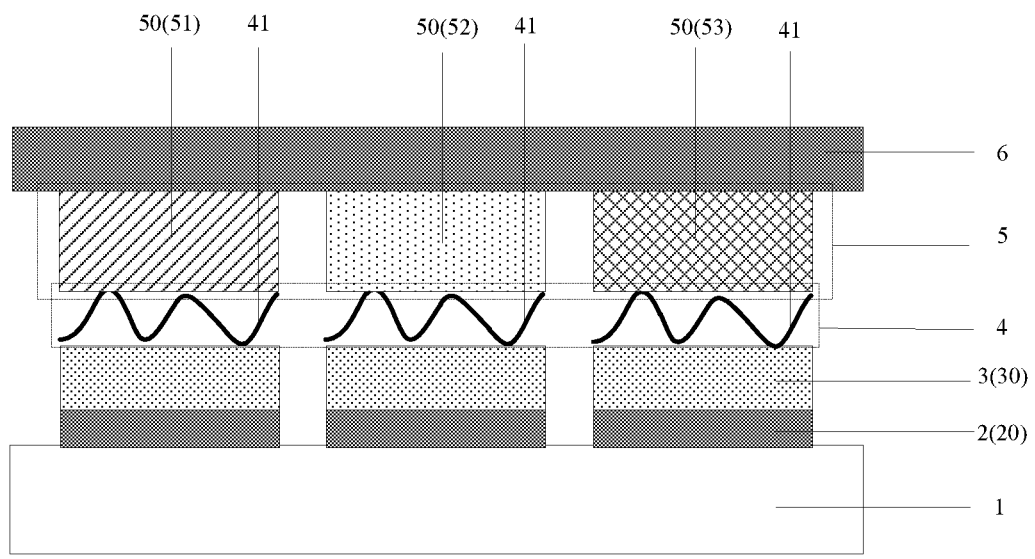
FIG. 1 is a schematic structural diagram of a quantum dot light emitting panel provided by an embodiment of the present disclosure.

In view of this, referring to FIG. 1, an embodiment of the present disclosure provides a quantum dot light emitting panel, including:
- a base substrate 1; in some embodiments, the base substrate 1 may be a glass base substrate;
- a cathode layer 2, disposed on a side of the base substrate 1; wherein, a material of the cathode layer 2 may be an indium tin oxide (ITO) semiconductor transparent conducting material, or fluorine-doped SnO2 conducting glass (SnO2:F, FTO), or indium zinc oxide (IZO), and, the cathode layer 2 may include a plurality of spaced cathodes 20;
- an electron transfer layer 3, disposed on a side of the cathode layer 2 facing away from the base substrate 1; wherein, specifically, the electron transfer layer 3 may include a plurality of spaced electron transfer portions 30;
- a quantum dot light emitting layer 5, disposed on a side of the electron transfer layer 3 facing away from the cathode layer 2, including at least two kinds of light emitting portions 50 which emit lights in different wavelength ranges; for example, the quantum dot light emitting layer may include a first light emitting portion 51 emitting red light, a second light emitting portion 52 emitting green light and a third light emitting portion 53 emitting blue light, a wavelength range of the emitted light of the first light emitting portion 51 may be 630 nm to 760 nm, a range of the emitted light of the second light emitting portion 52 may be 491 nm to 560 nm, and a wavelength range of the emitted light of the third light emitting portion 53 may be 450 nm to 490 nm., In some embodiments, one first light emitting portion 51, one second light emitting portion 52 and one third light emitting portion 53 are arranged in that order and may form one pixel, and a plurality of pixels are distributed in an array;
- a photosensitive polymer film layer 4, disposed between the quantum dot light emitting layer 5 and the electron transfer layer 3, having photosensitive portions 41 in a one-to-one correspondence with the light emitting portions 50, and configured such that molecular chains break when the photosensitive polymer film layer is subjected to preset light irradiation; in some embodiments, the photosensitive polymer film layer 4 may be a polymer compound formed by repeatedly connecting particular structural units for multiple times through covalent bonds and with relative molecular mass being 20,000 to 50,000; the photosensitive polymer film layer is a polymer compound of which molecular chains may break when irradiated by preset light (e.g., ultraviolet light); in addition, the photosensitive portions 41 and the light emitting portions 50 are in one-to-one correspondence, it may be understood that an orthographic projection of each photosensitive portion 41 on the base substrate 1 is overlapped with an orthographic projection of one light emitting portion 50 on the base substrate 1; in some embodiments, the centers of the two may coincide and areas of the two are equal. Of course, considering actual process errors, it is difficult to require the photosensitive portions 41 and the light emitting portions 50 to be completely superposed, so the two may specifically be substantially superposed; and
- an anode layer 6, disposed on a side of the quantum dot light emitting layer 5 facing away from the photosensitive polymer film layer 4.

In the quantum dot light emitting panel provided by the embodiment of the present disclosure, a layer of photosensitive polymer thin film 4 sensitive to ultraviolet rays is disposed on the side of the electron transfer layer 3 facing away from the base substrate 1, then the quantum dot light emitting layer 5 is introduced, afterwards, with a mask adopted for shielding, preset light (e.g., ultraviolet light) irradiation is performed. In a portion where irradiated by the preset light, the molecular chains of the photosensitive polymer film layer 4 break and may be removed by flushing through a first solution (e.g., ethanol solvent), and in the portion where not irradiated by the preset light, the photosensitive polymer film layer 4 is reserved. By repeating the above steps, patterning of the plurality of light emitting portions 50 different in light emitting range may be realized, and then the full-color and high-resolution quantum dot panel may be manufactured. In the process of forming the full-color quantum dot display panel, a developing solution that can damage a quantum dot film layer is not required, so that the problem that the light emitting efficiency of the quantum dot light emitting panel is affected by damage of the quantum dot light emitting layer 5 in the process of manufacturing the full-color panel can be avoided.

In some embodiments, an electron mobility of the photosensitive polymer film layer 4 is lower than that of the electron transfer layer 3, so that the photosensitive polymer film layer 4 may acts as an electron blocking layer while realizing patterning of the quantum dot light emitting layer 5. Therefore, the problem of the excessively high injection rate of the electron transfer layer (e.g., zinc oxide) can be effectively solved, carrier injection balance is regulated, and the device light emitting efficiency is improved.

Figure 2:
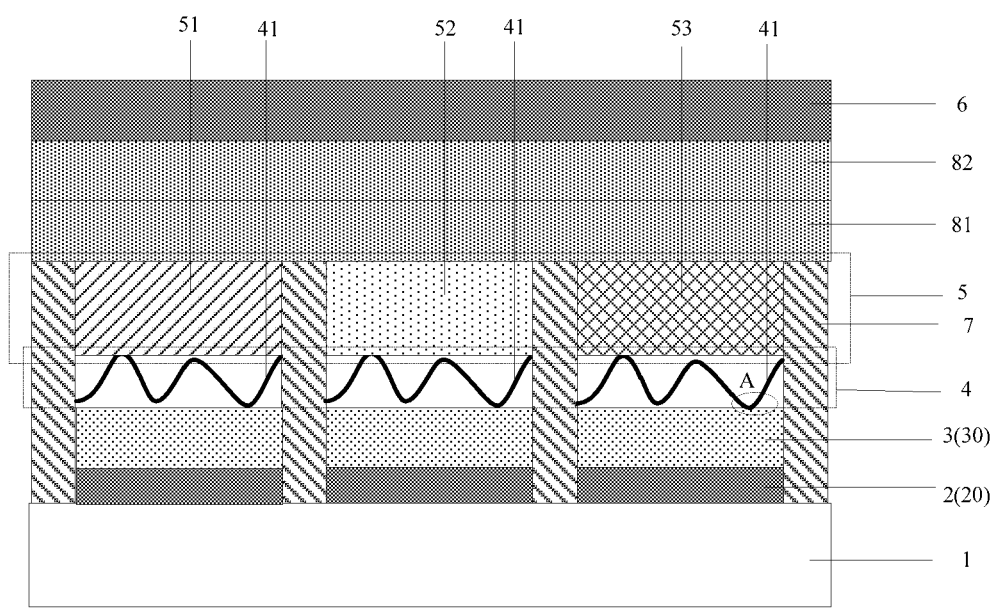
FIG. 2 is a schematic structural diagram of another quantum dot light emitting panel provided by an embodiment of the present disclosure.

In some embodiments, referring to FIG. 2, blocking portions 7 are provided between the photosensitive portions 41. In the embodiment of the present disclosure, the quantum dot light emitting panel may further include a pixel defining layer, the pixel defining layer includes a plurality of blocking portions 7, and the blocking portions 7 are located between the adjacent photosensitive portions 41 and also located between the adjacent light emitting portions 50, and may define film layers with different light emitting colors in different regions to form respective independent structures.

In some embodiments, in combination with FIG. 2, a hole transfer layer 81 is further included between the quantum dot light emitting layer 5 and the anode layer 6; and a hole injection layer 82 is further included between the hole transfer layer 81 and the anode layer 6. A material of the hole transfer layer 81 may be an organic material, and a material of the hole injection layer 82 may be an organic material. In some embodiments, the hole transfer layer 81, the hole injection layer 82 and the anode layer 6 may be of a whole-layer structure to simplify process steps.

In some embodiments, the electron transfer layer 3 and the photosensitive polymer film layer 4 are connected through a covalent bond. In the embodiment of the present disclosure, the electron transfer layer 3 and the photosensitive polymer film layer 4 are connected through the covalent bond, which may enhance binding force of the electron transfer layer 3 and the photosensitive polymer film layer 4 and avoid the situation that the photosensitive polymer film layer 4 of which molecular chains do not break is cleaned off in a subsequent cleaning process.

Specifically, the electron transfer layer 3 has a hydroxy, the photosensitive polymer film layer 4 has an amino, the electron transfer layer 3 and the photosensitive polymer film layer 4 form the covalent bond through the hydroxy and the amino. In some embodiments, the covalent bond may be a hydrogen bond.

Figure 3:
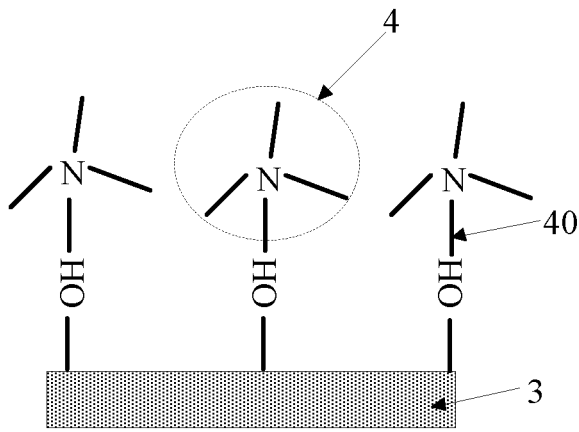
FIG. 3 is an amplified schematic diagram of a position A in FIG. 2.

In some embodiments, the electron transfer layer is made of a metal oxide. Specifically, a material of the metal oxide may be zinc oxide, magnesium zinc oxide or aluminum zinc oxide. In the embodiment of the present disclosure, as the electron transfer layer, the metal oxide may have relatively better electron transfer performance, but a surface of the metal oxide is prone to forming oxygen holes, which will quench the quantum dot light emitting layer. While the photosensitive polymer film layer has the amino, the amino of the photosensitive polymer film layer may further eliminate the oxygen holes on the surface of the metal oxide, in addition to good binding performance of forming the hydrogen bond with the hydroxy on the surface of the metal oxide, then the quenching effect of the metal oxide on the quantum dot light emitting layer may be lowered, and thus the performance of the quantum dot light emitting panel may be improved. Specifically, referring to FIG. 3, the electron transfer layer 3 is zinc oxide, and a hydroxyl functional group (—OH) on a surface of the zinc oxide and a quaternary amino functional group on a photosensitive polymer compound may form a hydrogen bond, so that the electron transfer layer 3 and the photosensitive polymer film layer 4 may be bound more tightly, which is conductive to adhering of the photosensitive polymer film layer 4. FIG. 3 is an amplified schematic diagram of a position A in FIG. 2.

In some embodiments, the photosensitive portions 41 further have one or a combination of following covalent bonds: a C—C bond; a C—O bond; an ester bond; or a thioester bond.

Here, the C—C bond, the C—O bond, the ester bond and the thioester bond are subjected to covalent bond breaking when subjected to preset light irradiation. In some embodiments, a material of the photosensitive portions 41 may be a polyetherimido compound or poly-p-phenylene benzobisthiazole. In the embodiment of the present disclosure, energy (365 nm, equivalent to 3.39 ev) of the preset light (e.g., ultraviolet light) may be equivalent to energy of covalent bonds such as C—C and C—O in the polyetherimido compound or the ester bond and the thioester bond in a polyether ester imido compound. These covalent bonds will break after ultraviolet radiation of a particular wavelength to form a large number of charged polymer free radicals with strong chemical activity, and molecular chains break through recombination of the free radicals. The portion having molecular chains broken in the photosensitive polymer film layer is removed when flushed by an alcohols solvent.

In some embodiments, the photosensitive portions 41 may be the polyetherimido compound, and a material of the polyetherimido compound may be:

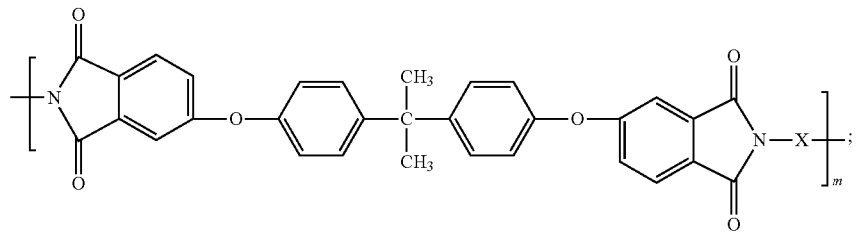

here m is the quantity of structural units, and 1<m<100.

In some embodiments, an X functional group is one of following:

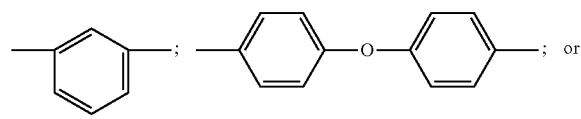

-continued

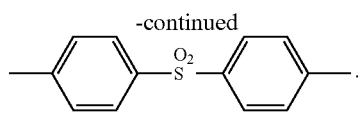

In some embodiments, the photosensitive portions 41 may also be a poly-p-phenylene benzo-bisthiazole compound, and a material of the poly-p-phenylene benzo-bisthiazole compound may be:

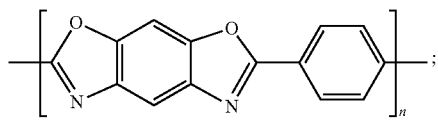

here n is the quantity of structural units, and $1<n<100$.

In some embodiments, a thickness of the light emitting portions is 30 nm to 60 nm. On the premise of qualifying a good light emitting performance, the light emitting portions may block ultraviolet light in a process of patterning of quantum dots of different colors. For example, in a process that first a patterned red quantum dot thin film, then a patterned green quantum dot thin film and finally a blue quantum dot thin film are formed, although the photosensitive portions under the already formed red quantum dot film will be irradiated again when the green quantum dot thin film is patterned, molecular chains of the photosensitive portions under the red quantum dot film cannot break because the thickness of the film layer in that position at this stage is large (the thickness of the red light emitting portions is 30 nm to 60 nm) and energy of ultraviolet light reaching the photosensitive portions under the red quantum dot film is weak. Either the photosensitive portions under the red quantum dot film or the red quantum dot film will not be removed even washed by anhydrous ethanol. Similarly, when the patterned blue quantum dot film is formed, the green quantum dot film will not be removed due to the large thickness.

Based on the same inventive concept, an embodiment of the present disclosure further provides a display device, including the quantum dot light emitting panel provided by the embodiment of the present disclosure.

Figure 4:
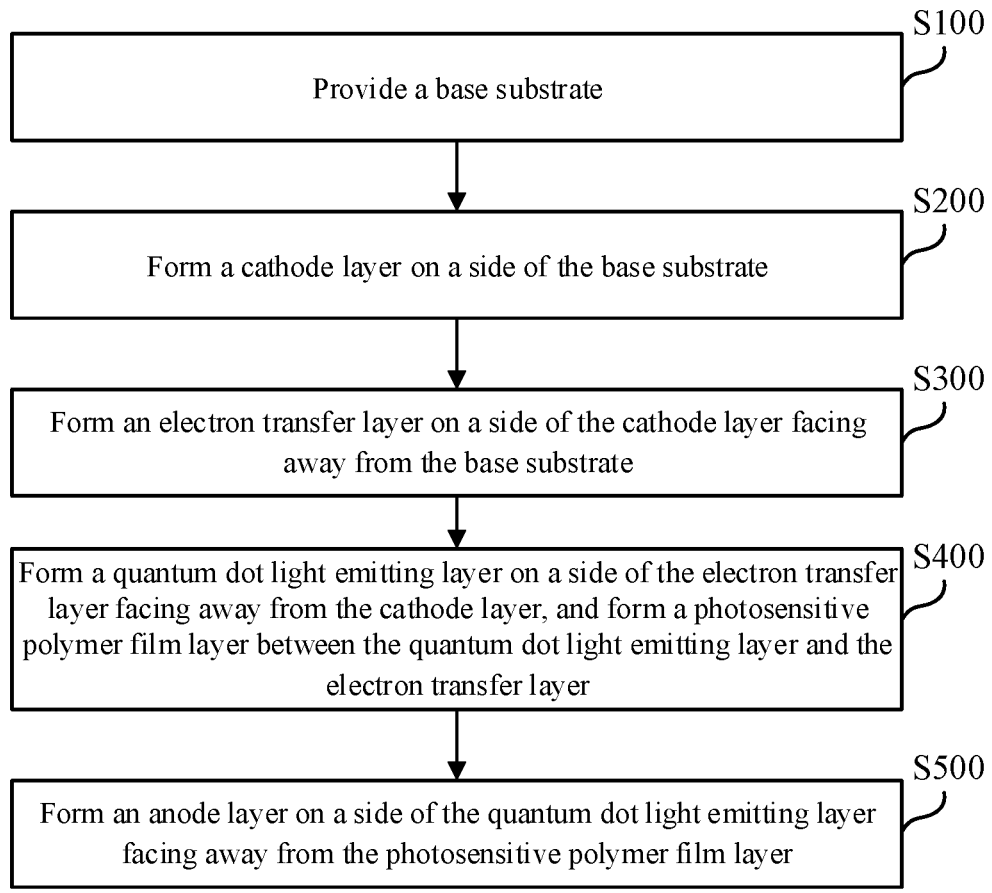
FIG. 4 is a schematic flow chart of a manufacturing method of a quantum dot light emitting panel provided by an embodiment of the present disclosure.

Based on the same inventive concept, referring to FIG. 4, an embodiment of the present disclosure further provides a manufacturing method of a quantum dot light emitting panel, including:

S100, providing a base substrate;

S200, forming a cathode layer on a side of the base substrate;

S300, forming an electron transfer layer on a side of the cathode layer facing away from the base substrate;

S400, forming a quantum dot light emitting layer on a side of the electron transfer layer facing away from the cathode layer, and forming a photosensitive polymer film layer between the quantum dot light emitting layer and the electron transfer layer; wherein the quantum dot light emitting layer includes at least two light emitting portions having different wavelength ranges of emitted light; the photosensitive polymer film layer includes photosensitive portions in a one-to-one correspondence with the light emitting portions, and is configured such that molecular chains break when the photosensitive polymer film layer is subjected to preset light irradiation; and S500, forming an anode layer on a side of the quantum dot light emitting layer facing away from the photosensitive polymer film layer.

In S400, forming the quantum dot light emitting layer on the side of the electron transfer layer facing away from the cathode layer, and forming the photosensitive polymer film layer between the quantum dot light emitting layer and the electron transfer layer, includes:

S411, forming a photosensitive polymer thin film on a side of the electron transfer layer facing away from the cathode layer. The photosensitive polymer thin film may be a polyetherimido compound. In some embodiments, the polyetherimido compound may be dissolved in ethanol, and the solution may be spin-coated on one side of the electron transfer layer facing away from the cathode layer; heating is performed to volatilize a solvent, and thus the photosensitive polymer thin film is formed on the side of the electron transfer layer facing away from the cathode layer;

S412, forming a first quantum dot light emitting thin film on a side of the photosensitive polymer thin film facing away from the electron transfer layer; the first quantum dot light emitting thin film may be, for example, a red quantum dot light emitting thin film emitting red light;

S413, shielding a first region via a first mask, and irradiating by preset light, to make molecular chains of the photosensitive polymer thin film not shielded by the first mask break; in some embodiments, the preset light may be ultraviolet light;

S414, removing the photosensitive polymer thin film with the molecular chains broken and the first quantum dot light emitting thin film above via cleaning by a solution to form a first light emitting portion; here cleaning by the solution may be flushing by anhydrous ethanol;

S415, forming a photosensitive polymer thin film on a side of the electron transfer layer facing away from the cathode layer; the photosensitive polymer thin film may be a polyetherimido compound. In some embodiments, the polyetherimido compound may be dissolved in ethanol, and the solution is spin-coated on one side of the electron transfer layer facing away from the cathode layer; heating is performed to volatilize a solvent, and thus the photosensitive polymer thin film is formed on the side of the electron transfer layer facing away from the cathode layer;

S416, forming a second quantum dot light emitting thin film on a side of the photosensitive polymer thin film facing away from the electron transfer layer; the second quantum dot light emitting thin film may be, for example, a green quantum dot light emitting thin film emitting green light;

S417, shielding a second region via a second mask, and irradiating by the preset light, to make molecular chains of the photosensitive polymer thin film not shielded by the second mask or by the first light emitting portion break, wherein the second region and the first region are not overlapped with each other; the preset light may be ultraviolet light;

S418, removing the photosensitive polymer thin film with the molecular chains broken and the second quantum dot light emitting thin film above via cleaning by a solution to form a second light emitting portion; cleaning by the solution may be flushing by anhydrous ethanol;

S419, forming a photosensitive polymer thin film on a side of the electron transfer layer facing away from the cathode layer; the photosensitive polymer thin film may specifically be a polyetherimido compound. In some embodiments, the polyetherimido compound may be dissolved in ethanol, and the solution is spin-coated on one side of the electron transfer layer facing away from the cathode layer; heating is performed to volatilize a solvent, and thus the photosensitive polymer thin film is formed on the side of the electron transfer layer facing away from the cathode layer;

S420, forming a third quantum dot light emitting thin film on a side of the photosensitive polymer thin film facing away from the electron transfer layer; the third quantum dot light emitting thin film may be, for example, a blue quantum dot light emitting thin film emitting blue light;

S421, shielding a third region via a third mask, and irradiating is performed by the preset light, to make molecular chains of the photosensitive polymer thin film not shielded by the third mask, the first light emitting portion or the second light emitting portion break, wherein the third region is not overlapped with the first region or the second region; here the preset light may be ultraviolet light; and S422, removing the photosensitive polymer thin film with the molecular chains broken and the third quantum dot light emitting thin film above via cleaning by a solution to form a third light emitting portion; and cleaning by the solution may specifically be flushing by anhydrous ethanol.

In some embodiments, a material of the electron transfer layer may be zinc oxide nanoparticles or zinc oxide.

When the material of the electron transfer layer is the zinc oxide nanoparticles, in S300, forming the electron transfer layer on the side of the cathode layer facing away from the base substrate, includes:

S301, forming a solution for spin-coating including the zinc oxide nanoparticles; and S302, spin-coating said solution on one side of the cathode layer facing away from the base substrate.

When the material of the electron transfer layer is the zinc oxide, in S300, forming the electron transfer layer on the side of the cathode layer facing away from the base substrate, includes:

S303, dissolve zinc acetate or zinc nitrate in a mixed solution of ethanol amine and n-butanol to form a zinc-containing precursor solution;

S304, performing spin-coating by adding dropwise the zinc-containing precursor solution onto one side of the cathode layer facing away from the base substrate; and S305, heating to volatilize a solvent.

Figure 5:
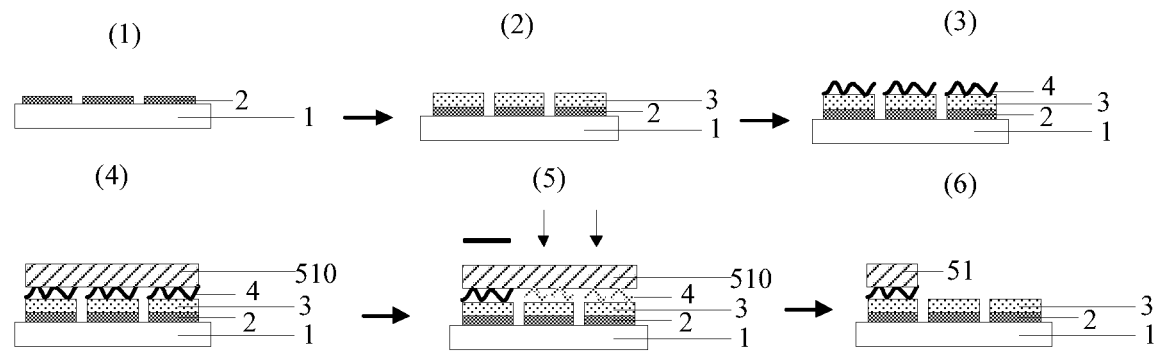
FIG. 5 is a schematic diagram illustrating a flow of forming a patterned red quantum dot film in an embodiment of the present disclosure.
Figure 6:
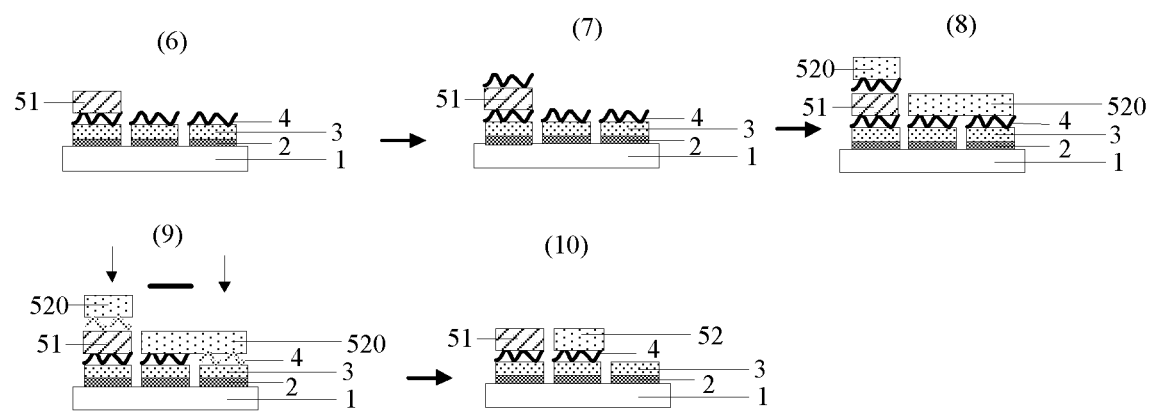
FIG. 6 is a schematic diagram illustrating a flow of forming a patterned green quantum dot film in an embodiment of the present disclosure.
Figure 7:
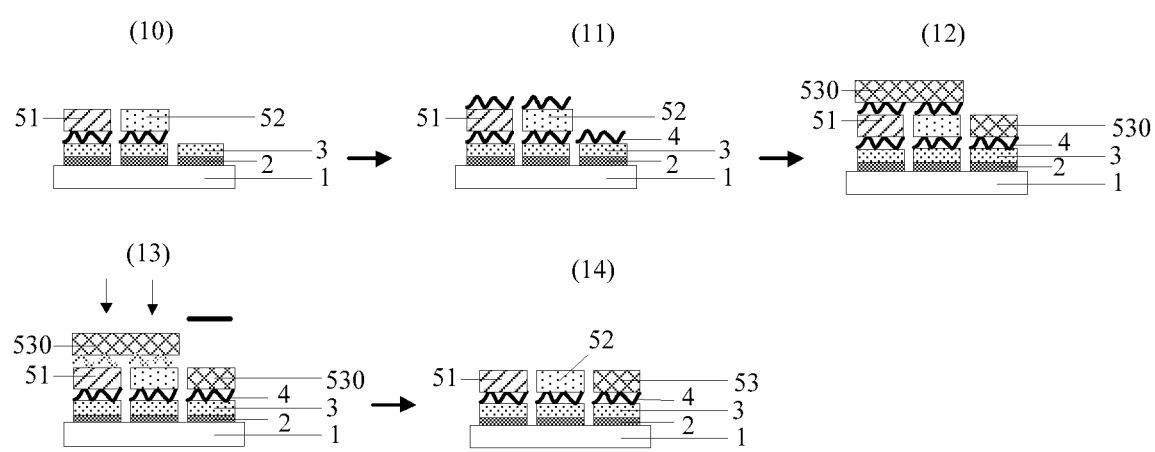
FIG. 7 is a schematic diagram illustrating a flow of forming a patterned blue quantum dot film in an embodiment of the present disclosure.

In combination with FIG. 5 to FIG. 7, the manufacturing method of the quantum dot light emitting panel provided by the embodiment of the present disclosure is further described in detail below.

Step 1, red quantum dots (the first light emitting portion 51) are introduced into a red pixel region.

(1) Cleaning is performed. Conducting glass (the base substrate 1 with the cathode layer 2 formed, and a material of the cathode layer 2 may be ITO or FTO) is ultrasonically cleaned by water and isopropanol respectively, and is subjected to ultraviolet UV treatment for 5 min to 10 min.

(2) The electron transfer layer 3 is formed. The electron transfer layer 3 may be a zinc oxide based nanoparticle thin film or a zinc oxide thin film.

(a) The zinc oxide nanoparticle thin film is prepared. For example, the zinc oxide nanoparticles are spin-coated, and heated at 80° C. to 120° C. to form the film. A material of the electron transfer layer 3 may further be ion-doped zinc oxide nanoparticles, such as Mg—, In—, Al— and Ga-doped magnesium oxide nanoparticles, a rotating speed of a spin coater is set to be 500 rpm to 2,500 rpm to adjust a thickness of the film layer.

(b) The zinc oxide thin film is prepared; and 2 g of zinc acetate (or zinc nitrate) is dissolved in 10 mL of a mixed solution of ethanol amine and n-butanol, the conducting glass is placed in the spin coater, 90 µL to 120 µL of a zinc precursor solution is dropwise added onto the conducting glass, and spin-coated. The conducting glass is placed on a heating stage of 250° C. to 300° C., and heated to volatilize a solvent, and a polyetherimide film layer is introduced onto the conducting glass.

(3) The photosensitive polymer film layer 4 rich in amino is formed. 0.5 g of a polyetherimido compound is dissolved in 5 mL of ethanol and dropwise added to the conducting glass to subject to spin-coating, then the conducting glass is placed on a heating stage of 250° C. to 300° C. and heated to volatilize a solvent, and the zinc oxide film layer is finally introduced to the ITO glass. The photosensitive polymer film layer 4 in this step may further select polymers sensitive to ultraviolet rays such as poly-p-phenylene benzo-bisthiazole.

(4) The red quantum dots are spin-coated. The substrate is spin-coated with a low-boiling-point solution (chloroform, toluene, n-hexane, n-octane or n-heptane) of the red quantum dots, and the solution is dried at 80° C. to 120° C. to form a film.

(5) Exposure via mask is performed. A mask and the conducting glass are aligned, the red pixel region on the conducting glass is shielded by the mask, and regions other than the red pixel region are exposed by ultraviolet rays.

(6) Film is formed by flushing and curing. The substrate is flushed by anhydrous ethanol, breaking polymers in the exposure regions are cleaned off, and the photosensitive polymer thin film and the red quantum dot thin film in a red target region are reserved. The conducting glass is placed on a heating stage of 150° C. to 200° C., a solvent is heated, and a film is formed by curing.

Step 2, green quantum dots (the second light emitting portion 52) are introduced into a green pixel region.

(7) The photosensitive polymer thin film 4 rich in amino is introduced again. 90 µL to 120 µL of a polyetherimide ethanol solution is dropwise added to the conducting glass, and spin-coated, then the conducting glass is placed on a heating stage of 250° C. to 300° C. and heated to volatilize a solvent, and the polyetherimide film layer is introduced to the conducting glass.

(8) The green quantum dots is spin-coated. The substrate is spin-coated with a low-boiling-point solution (chloroform, toluene, n-hexane, n-octane or n-heptane) of the green quantum dots, and the solution is dried at 80° C. to 120° C. to form a film.

(9) Exposure via mask is performed. An exposure machine and the conducting glass are aligned, and exposure is performed on regions on the conducting glass other than the green pixel region.

(10) Film is formed by flushing and curing. The substrate is flushed by anhydrous ethanol, breaking polymers in the exposure regions are cleaned off, and the photosensitive polymer thin film and the green quantum dot thin film in a green target region are reserved. The conducting glass is placed on a heating stage of 150° C. to 200° C., a solvent is heated, and a film is formed by curing.

Step 3, blue quantum dots (the third light emitting portion 53) are introduced into a blue pixel region.

(11) The photosensitive polymer thin film rich in amino is introduced again. 90 μL to 120 μL of a polyetherimide ethanol solution is dropwise added to the conducting glass, and spin-coated, then the conducting glass is placed on a heating stage of 250° C. to 300° C. and heated to volatilize a solvent, and the polyetherimide film layer is introduced to the conducting glass.

(12) The blue quantum dots are spin-coated. The substrate is spin-coated with a low-boiling-point solution (chloroform, toluene, n-hexane, n-octane or n-heptane) of the blue quantum dots, and the solution is dried at 80° C. to 120° C. to form a film.

(13) Exposure via mask is performed. An exposure machine and the conducting glass are aligned, and exposure is performed on regions on the conducting glass other than the blue pixel region.

(14) Film is formed by flushing and curing. The substrate is flushed by anhydrous ethanol, breaking polymers in the exposure regions are flushed away, and the photosensitive polymers and the blue quantum dots in a blue target region are reserved. The conducting glass is placed on a heating stage of 150° C. to 200° C., a solvent is heated, and a film is formed by curing.

Step 4, a hole transfer layer is formed. The hole transfer layer is formed on the conducting glass through spin-coating or evaporation or the like. An organic substance for forming the hole transfer layer may select TFB (poly(9,9-dioctyl fluorene-co-N-(4-butylphenyl)diphenylamine)), or PVK (polyvinyl carbazole) or other commercial hole transfer compounds. For example, a condition of forming the film by TFB spin-coating is: forming the film in inert gas of 130° C. to 150° C. The thickness of the film layer may be regulated according to the rotating speed of the spin coater.

Step 5, a hole injection layer is formed. The hole injection layer is formed on the conducting glass through spin-coating or evaporation or the like. An organic substance for forming the hole injection layer may select PEDOT:PSS 4083 (poly3,4-ethylene dioxythiophene/polystyrenesulfonate) or other commercial compounds suitable for the hole injection layer. For example, the temperature for forming film by a PEDOT spin-coating is 130° C. to 150° C. in air. The thickness of the film layer may be regulated according to the rotating speed of the spin coater.

Step 6, an anode is formed. Finally, an anode material is introduced, for example, an aluminum film or a silver film is evaporated, or an indium zinc oxide (IZO) film is sputtered to prepare a QLED device.

Step 7, packaging is performed. A packaging cover plate is adopted for covering, the device is packaged by ultraviolet curing glue, and thus a quantum dot light emitting diode is prepared.

It should be noted that: the patterning order of the red, green and blue quantum dots may be freely changed according to actual needs. In addition, it can be understood that, although the photosensitive portions under the already formed red quantum dot film will be irradiated again when the green quantum dot thin film is patterned, molecular chains of the photosensitive portions under the red quantum dot film cannot break because the thickness of the film layer in that position at this stage is large and energy of ultraviolet light reaching the photosensitive portions under the red quantum dot film is weak. Either the photosensitive portions under the red quantum dot film or the red quantum dot film will not be removed even washed by anhydrous ethanol. Similarly, when the patterned blue quantum dot film is formed, the green quantum dot film will not be removed.

The quantum dot light emitting panel provided by the embodiment of the present disclosure has a structural feature 1: the quantum dot light emitting panel is a planar layered structure in multi-layer stack (in combination with FIG. 2), and the functional layers are, from bottom to top, respectively: the base substrate 1, the cathode layer 2, the electron transfer layer 3 (zinc oxide), the photosensitive polymer thin film layer 4, the quantum dot light emitting layer 5, the hole transfer layer 82, the hole injection layer 84 and the anode 6. The film layers can be identified in such a way as: such a structure can be subjected to structure determination and composition analysis by preparing cross-sectional slices of the quantum dot light emitting panel with the help of a high-resolution transmission electron microscope and cross-sectional scanning electron microscope (SEM).

The quantum dot light emitting panel has a typical structural feature 2: the particular photosensitive polymer film layer 3 (the polyetherimido compound or the poly-p-phenylene benzo-bisthiazole) is located between the electron transfer layer 3 (zinc oxide layer) and the quantum dot light emitting layer 5. Taking the polyetherimido compound as an example, the hydroxyl functional group (—OH) on the surface of zinc oxide and the amino functional group on a molecular structure of the polyetherimido compound form a particular hydrogen bond structure, as shown in FIG. 3; the thickness of the photosensitive polymer film layer 3 may be: 0.5 nm to 3 nm. The identification method is: such a structural feature can be subjected to structure determination and analysis through Fourier transform infrared spectroscopy (FTIR) and secondary ion mass spectroscopy (SIMS) determination. For example, the polyetherimido compound in the device may be characterized by FTIR, and characteristic peaks are as follows: double peaks at 1724 $cm^{-1}$ and 1778 $cm^{-1}$ are carbonyl absorption peaks in an imide ring; absorption bands at 1362 $cm^{-1}$, 1237 $cm^{-1}$ and 1275 $cm^{-1}$ belong to stretching vibration peaks of aryl ether C—O—C; and peaks at 1446 cm to 1630 $cm^{-1}$ are stretching vibration peaks of a benzene ring skeleton.

The structure of the QLED device has a typical structural feature 3: the size of the quantum dots in the quantum dot light emitting layer 5 of the device is 3 nm to 20 nm. The embodiment of the present disclosure may apply various quantum dots, including: oil-soluble quantum dots such as CdTe, CdS, CdSe, ZnSe, InP, CuInS, CuInSe, PbS, CdS/ZnS, CdSe/ZnS, CdSe/ZnSeS, CdSe/CdS, ZnSe/ZnS, InP/ZnS, CuInS/ZnS, (Zn)CuInS/ZnS, (Mn)CuInS/ZnS, AgInS/ZnS, (Zn)AgInS/ZnS, CuInSe/ZnS, CuInSeS/ZnS and PbS/ZnS. The quantum dot light emitting layer 5 is identified in a method including: (1) a crystal structural feature of the quantum dots can be judged through a high-resolution transmission electron microscopy (HRTEM) and an X-ray diffractometer (XRD); (2) an element composition feature of the quantum dots can be judged through an energy disperse spectroscopy (EDS); (3) a surface ligand feature of the quantum dots and functional groups of surface ligands can be subjected to qualitative and quantitative analysis through a Fourier transform infrared spectroscopy (FTIR), an ultraviolet visible absorption spectroscopy (UV-Vis) and hydrogen nuclear magnetic resonance (HNMR); and (4) a spectroscopic feature of the quantum dots, such as features of narrow fluorescence emission and wide absorption spectrum, can be determined through UV-Vis and photoluminescence spectroscopy (PL).

The embodiments of the present disclosure have the following beneficial effects: in the quantum dot light emitting panel provided by the embodiment of the present disclosure, the layer of photosensitive polymer thin film sensitive to ultraviolet rays is introduced on the side of the electron transfer layer facing away from the base substrate, and then the quantum dot light emitting layer is introduced. Afterwards, with the mask adopted for shielding, preset light (e.g., ultraviolet light) irradiation is performed, the portion where irradiated by the preset light, the molecular chains of the photosensitive polymer film layer break and may be removed by flushing through a first solution (e.g., ethanol solvent), and the portion where not irradiated by the preset light, the photosensitive polymer film layer is reserved. By repeating the above steps, patterning of the plurality of light emitting portions different in light emitting range can be realized, and then the full-color and high-resolution quantum dot panel can be manufactured. In the process of forming the full-color quantum dot display panel, a developing solution that can damage a quantum dot film layer is not required, so that the problem that the light emitting efficiency of the quantum dot light emitting panel is affected by damage of the quantum dot film layer in the process of manufacturing the full-color panel can be avoided.

Apparently, those skilled in the art can perform various changes and modifications on the disclosure without departing from the spirit and scope of the disclosure. Therefore, if these changes and modifications on the disclosure fall in the scope of the claims of the disclosure and their equivalent technologies, the disclosure is also intended to contain these changes and modifications.

What is claimed is:

1. A quantum dot light emitting panel, comprising:
a base substrate;
a cathode layer, disposed on a side of the base substrate;
an electron transfer layer, disposed on a side of the cathode layer facing away from the base substrate;
a quantum dot light emitting layer, disposed on a side of the electron transfer layer facing away from the cathode layer, comprising at least two light emitting portions having different wavelength ranges of emitted light;
a photosensitive polymer film layer, located between the quantum dot light emitting layer and the electron transfer layer, having photosensitive portions in a one-to-one correspondence with the light emitting portions, and configured such that molecular chains break when the photosensitive polymer film layer is subjected to preset light irradiation; and
an anode layer, disposed on a side of the quantum dot light emitting layer facing away from the photosensitive polymer film layer.

2. The quantum dot light emitting panel according to claim 1, wherein an electron mobility of the photosensitive polymer film layer is lower than an electron mobility of the electron transfer layer.

3. The quantum dot light emitting panel according to claim 1, wherein blocking portions are provided between the photosensitive portions.

4. The quantum dot light emitting panel according to claim 1, wherein the electron transfer layer and the photosensitive polymer film layer are connected through a covalent bond.

5. The quantum dot light emitting panel according to claim 4, wherein the electron transfer layer has a hydroxy, the photosensitive polymer film layer has an amino, and the electron transfer layer and the photosensitive polymer film layer form the covalent bond through the hydroxy and the amino.

6. The quantum dot light emitting panel according to claim 5, wherein the electron transfer layer is made of a metal oxide.

7. The quantum dot light emitting panel according to claim 6, wherein a material of the metal oxide is zinc oxide, magnesium zinc oxide or aluminum zinc oxide.

8. The quantum dot light emitting panel according to claim 7, wherein the photosensitive portions further comprise one or a combination of following covalent bonds:
a C—C bond;
a C—O bond;
an ester bond; or
a thioester bond; wherein
wherein the C—C bond, the C—O bond, the ester bond and the thioester bond break when being subjected to preset light irradiation.

9. The quantum dot light emitting panel according to claim 8, wherein a material of the photosensitive portions is:

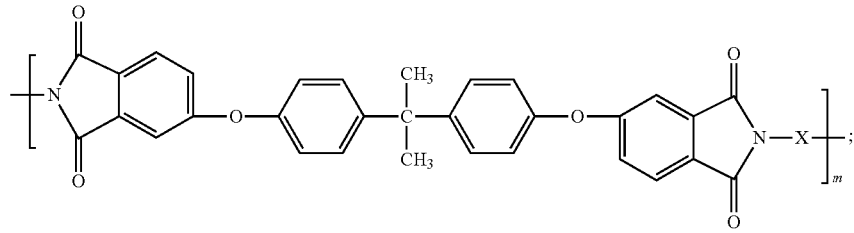

wherein m is a quantity of structural units, and 1<m<100.

10. The quantum dot light emitting panel according to claim 9, wherein an X functional group is one of following:

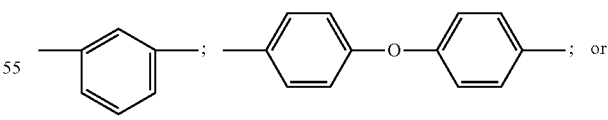

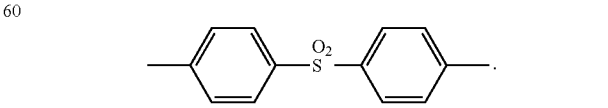

11. The quantum dot light emitting panel according to claim 8, wherein a material of the photosensitive portions is:

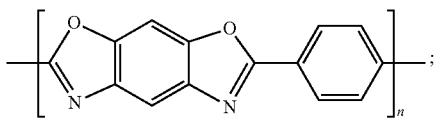

wherein n is a quantity of structural units, and 1<n<100.

12. The quantum dot light emitting panel according to claim 1, wherein a thickness of the light emitting portions is 30 nm to 60 nm.

13. The quantum dot light emitting panel according to claim 1, wherein
a hole transfer layer is provided between the quantum dot light emitting layer and the anode layer; and
a hole injection layer is provided between the hole transfer layer and the anode layer.

14. A display device, comprising a quantum dot light emitting panel, wherein the quantum dot light emitting panel comprises:
a base substrate;
a cathode layer, disposed on a side of the base substrate;
an electron transfer layer, disposed on a side of the cathode layer facing away from the base substrate;
a quantum dot light emitting layer, disposed on a side of the electron transfer layer facing away from the cathode layer, comprising at least two light emitting portions having different wavelength ranges of emitted light;
a photosensitive polymer film layer, located between the quantum dot light emitting layer and the electron transfer layer, having photosensitive portions in a one-to-one correspondence with the light emitting portions, and configured such that molecular chains break when the photosensitive polymer film layer is subjected to preset light irradiation; and
an anode layer, disposed on a side of the quantum dot light emitting layer facing away from the photosensitive polymer film layer.

15. A manufacturing method of a quantum dot light emitting panel according to claim 1, comprising:
providing a base substrate;
forming a cathode layer on a side of the base substrate;
forming an electron transfer layer on a side of the cathode layer facing away from the base substrate;
forming a quantum dot light emitting layer on a side of the electron transfer layer facing away from the cathode layer, and forming a photosensitive polymer film layer between the quantum dot light emitting layer and the electron transfer layer; wherein the quantum dot light emitting layer comprises at least two light emitting portions having different wavelength ranges of emitted light, and the photosensitive polymer film layer comprises photosensitive portions in a one-to-one correspondence with the light emitting portions, and is configured such that molecular chains break when the photosensitive polymer film layer is subjected to preset light irradiation; and
forming an anode layer on a side of the quantum dot light emitting layer facing away from the photosensitive polymer film layer.

16. The manufacturing method according to claim 15, wherein the forming the quantum dot light emitting layer on the side of the electron transfer layer facing away from the cathode layer and the forming the photosensitive polymer film layer between the quantum dot light emitting layer and the electron transfer layer, comprise:
forming a photosensitive polymer thin film on a side of the electron transfer layer facing away from the cathode layer;
forming a first quantum dot light emitting thin film on a side of the photosensitive polymer thin film facing away from the electron transfer layer;
shielding a first region via a first mask, and irradiating by preset light, to make molecular chains of the photosensitive polymer thin film not shielded by the first mask break; and
removing the photosensitive polymer thin film with the molecular chains breaking and the first quantum dot light emitting thin film via cleaning by a solution to form a first light emitting portion.

17. The manufacturing method according to claim 16, wherein the forming the photosensitive polymer thin film on the side of the electron transfer layer facing away from the cathode layer, comprises:
dissolving a polyetherimido compound or poly-p-phenylene benzo-bisthiazole into ethanol, and spin-coating onto a side of the electron transfer layer facing away from the cathode layer; and
heating to volatilize a solvent.

18. The manufacturing method according to claim 17, wherein the irradiating by the preset light, comprises: irradiating by ultraviolet light.

19. The manufacturing method according to claim 18, wherein the cleaning by the solution, comprises: flushing by anhydrous ethanol.

* * * * *